US006225784B1

(12) United States Patent
Kinoshita et al.

(10) Patent No.: US 6,225,784 B1
(45) Date of Patent: May 1, 2001

(54) BATTERY CONTROL APPARATUS FOR BATTERY CARRIED BY HYBRID VEHICLE

(75) Inventors: Naoki Kinoshita; Akira Fujimura; Nobuyuki Kawarada, all of Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/644,578

(22) Filed: Aug. 24, 2000

(30) Foreign Application Priority Data

Aug. 27, 1999 (JP) .................................................. 11-242355

(51) Int. Cl.$^7$ .......................... H01M 10/44; H01M 10/46
(52) U.S. Cl. ............................................. 320/132; 320/130
(58) Field of Search ...................................... 320/104, 123, 320/127, 128, 132, 137, 150, DIG. 21

(56) References Cited

U.S. PATENT DOCUMENTS 5,652,502 * 7/1997 Van Phuoc et al. .

5,955,869 * 9/1999 Rathmann .

* cited by examiner

*Primary Examiner*—Edward H. Tso
(74) *Attorney, Agent, or Firm*—Arent Fox Kintner Plotkin & Kahn, PLLC

(57) ABSTRACT

The battery control apparatus of the present invention is provided for a hybrid vehicle with a combustion engine for outputting driving force, an electric motor for generating a force for assisting the output from the engine, and a power storage unit (battery) for supplying power to the motor and for storing energy regenerated by the motor acting as a generator when the assisting force is not required. The battery control apparatus comprises: a remaining battery charge calculator for calculating remaining battery charge; a battery temperature measuring device (temperature sensor) for measuring the temperature of the battery; a charging permitting device for permitting charging when the remaining battery charge, which was calculated by the remaining battery charge calculator, is equal to or below a predetermined value; and a charging/discharging controller for setting the predetermined value, based on the temperature of the battery measured by the battery temperature measuring device.

3 Claims, 5 Drawing Sheets

BATTERY CONTROL APPARATUS FOR BATTERY CARRIED BY HYBRID VEHICLE

BACKGROUND OF THE INVENTION

1. Field of the Invention

The present invention relates to a battery control apparatus for controlling a battery carried by a hybrid vehicle.

This application is based on Japanese Patent Application No. Hei 11-242355, the contents of which are incorporated herein by reference.

2. Description of the Related Art

Conventionally, hybrid vehicles which carry electric motors as power sources for driving the vehicles in addition to engines are known. There are two types of the conventional hybrid vehicle: parallel hybrid vehicles and series hybrid vehicles. The series hybrid vehicle drives the motor by electric power generated by a generator which is driven by the engine, and the motor drives the wheels.

Since the engine and the wheels are not mechanically connected, the engine can be driven at an approximate constant engine speed and within an engine speed range in which the fuel consumption is reduced and the emissions are decreased. The series hybrid vehicle can reduce the fuel consumption and the emission as compared with the conventional vehicle.

The parallel hybrid vehicle assists the drive shaft of the engine by the motor connected to the engine, stores electric energy, produced by the motor which acts as a generator, in a power storage unit, and supplies the generated electric energy to other electrical equipment in the vehicle.

Although in the parallel hybrid vehicle the engine and the wheels are mechanically connected, the driving load on the engine is reduced, and the fuel consumption and the emission can be reduced as compared with the conventional vehicle.

In one type of the parallel hybrid vehicle, the motor is directly connected to the output shaft of the engine, and acts as a generator for charging a battery when the vehicle decelerates. In another type of parallel hybrid vehicle, either the engine or the motor, or both, generates the driving power, and a generator is separately provided.

These hybrid vehicles assist the output from the engine by the motor when the vehicles accelerates, charge batteries by deceleration regeneration when the vehicle decelerates, and perform various controls, to respond the driver's demands while maintaining the electric energy in the battery (hereinafter referred to as remaining battery charge).

The charging and discharging are repeated so that the remaining battery charge is maintained within a predetermined range (e.g., 20–80%) to protect the battery. This prevents over-charging and over-discharging of the battery, thereby lengthening the life of the battery and improving the efficiency.

However, there is the problem that the regenerated energy may not be efficiently accumulated in the battery because the upper limit of the charging is fixed at 80%.

Further, as the charging and discharging are repeated, while avoiding the over-charging and the over-discharging, so that the remaining battery charge is maintained within the intermediate range, the remaining charges of respective modules, which constitute the battery, may differ. Thus, the usable capacity of the battery may actually decrease, and the continuous operable time for assisting the output from the engine and for regenerating the energy may be shortened.

BRIEF SUMMARY OF THE INVENTION

It is therefore an object of the present invention to provide a battery control apparatus which prevents deterioration of the battery by controlling the charging/discharging electric currents, depending on the temperature of the battery, and which can efficiently accumulate regenerated energy.

In the first aspect of the present invention, the battery control apparatus (9) is provided for a hybrid vehicle with a combustion engine (1) for outputting driving force, an electric motor (2) for generating a force for assisting the output from the engine, and a power storage unit (battery 8) for supplying power to the motor and for storing energy regenerated by the motor acting as a generator when the assisting force is not required. The battery control apparatus comprises: a remaining battery charge calculator (91) for calculating remaining battery charge; a battery temperature measuring device (temperature sensor, or step S1) for measuring the temperature of the battery; a charging permitting device (step S8) for permitting charging when the remaining battery charge, which was calculated by the remaining battery charge calculator, is equal to or below a predetermined value (Sup); and a charging/discharging controller (step S4) for setting the predetermined value, based on the temperature of the battery measured by the battery temperature measuring device.

As long as the battery does not deteriorate, the present invention of the first aspect charges the battery while setting the upper limit value of the remaining battery charge near the fill charge point. Therefore, the regenerated energy can be efficiently collected without the battery deteriorating.

In the second aspect of the present invention, the battery control apparatus (9) is provided for a hybrid vehicle with a combustion engine (1) for outputting a driving force, an electric motor (2) for generating a force for assisting the output from the engine, and a power storage unit (8) for supplying power to the motor and for storing energy regenerated by the motor acting as a generator when the assisting force is not required. The battery control apparatus comprises: a remaining battery charge calculator (91) for calculating remaining battery charge; a battery temperature measuring device (temperature sensor, or step S2) for measuring the temperatures of a plurality of battery modules constituting the battery and for calculating a difference between the temperatures; a charging permitting device (step S8) for permitting charging when the remaining battery charge, which was calculated by the remaining battery charge calculator, is equal to or below a predetermined value (Sup); and a charging/discharging controller (step S4) for setting the predetermined value, based on the difference between the temperatures measured by the battery temperature measuring device.

The invention of the second aspect reduces the charging when the temperature difference increases, thus preventing the increase in the temperature difference.

In the third aspect of the present invention, the charging/discharging controller (step S6) sets a charging electric current, depending on the remaining battery charge calculated by the remaining battery charge calculator.

The invention of the third aspect reduces the charging electric current when the remaining battery charge is high, thereby preventing the deterioration of the battery.

DETAILED DESCRIPTION OF THE INVENTION

The embodiment of the battery control apparatus for a hybrid vehicle, according to the present invention, will be explained with reference to figures.

Figure 1:
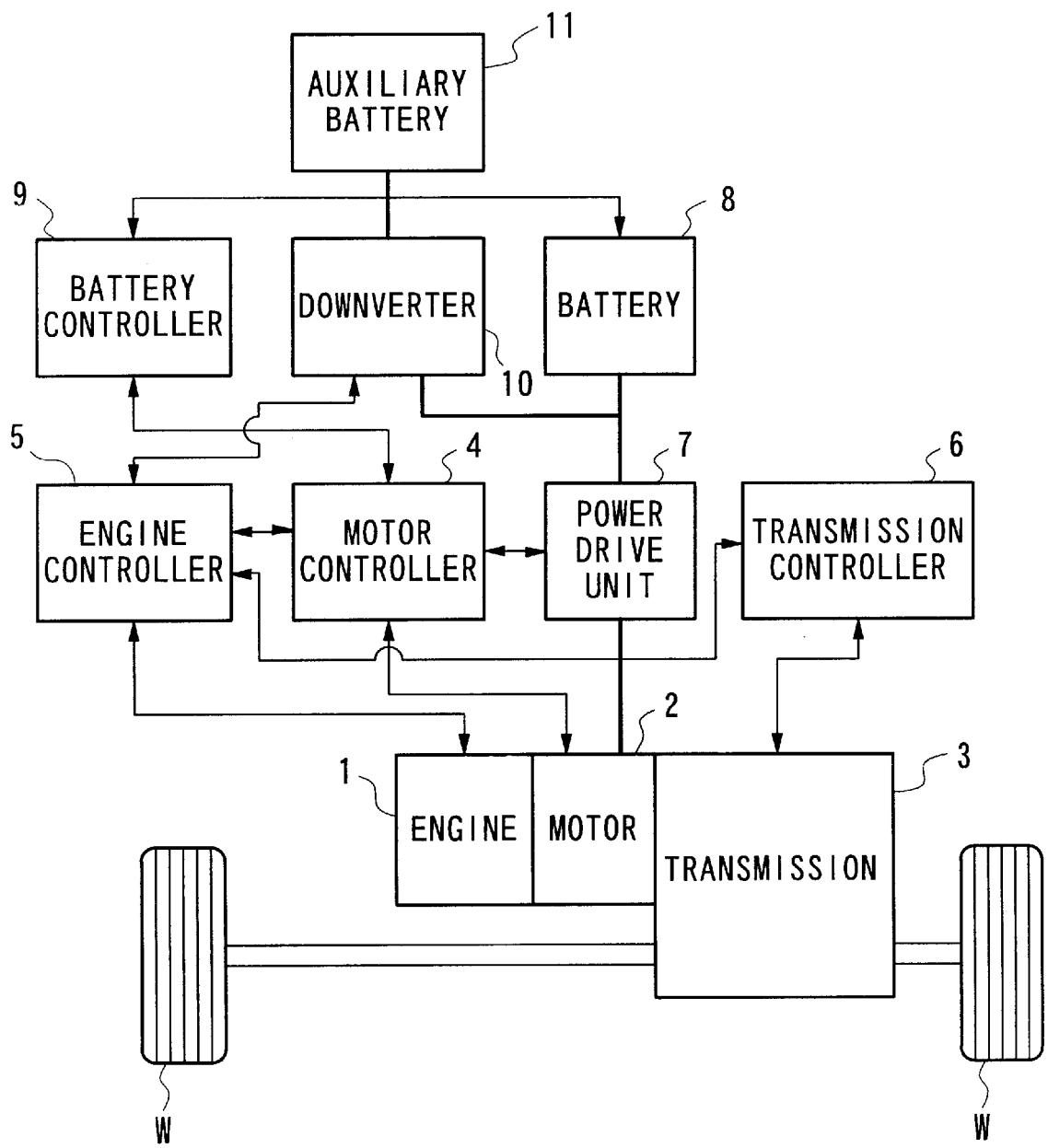
FIG. 1 is a diagram showing the entire construction of the hybrid vehicle of the present invention.

FIG. 1 is a block diagram showing the entire construction of the embodiment. 1 denotes an internal combustion engine, which is hereinafter referred to as an engine, and is indicated as an engine in the figures. 2 denotes an electric motor, which is hereinafter referred to as a motor, and is indicated as a motor in the figures. The motor 2 assists the output from the engine, depending on the driving conditions, and performs regeneration when the vehicle decelerates. 3 denotes a transmission, which is a manual or automatic transmission. The transmission 3 includes a clutch or a torque converter, a forward/reverse switching mechanism, a gear shifting mechanism, a differential gear, and the like. The transmission 3 transmits the drive power from the engine 1 and the motor 2 to driving wheels W.

4 denotes a motor controller for controlling the rotation of the motor 2. 5 denotes an engine controller for controlling the engine 1. 6 denotes a transmission controller for controlling the transmission 3. 7 denotes a power drive unit for sending and receiving electric power to and from the motor 2 according to control signals from the motor controller 4. 8 denotes a high voltage battery for supplying electric power to the motor 2 and for storing regenerated energy generated by the motor 2 when the drive power is not required, and comprises a plurality of modules connected each other. 9 denotes a battery controller for monitoring the state of the battery 8 and for controlling the amount of charge and discharge, depending on the state of the battery 8. 10 denotes a downverter for reducing and outputting the voltage of the battery 8. 11 denotes a 12-volt auxiliary battery for supplying electric go power to electrical equipments in the vehicle. The auxiliary battery 11 is charged by the electric power from the battery 8 via the downverter 10.

Figure 2:
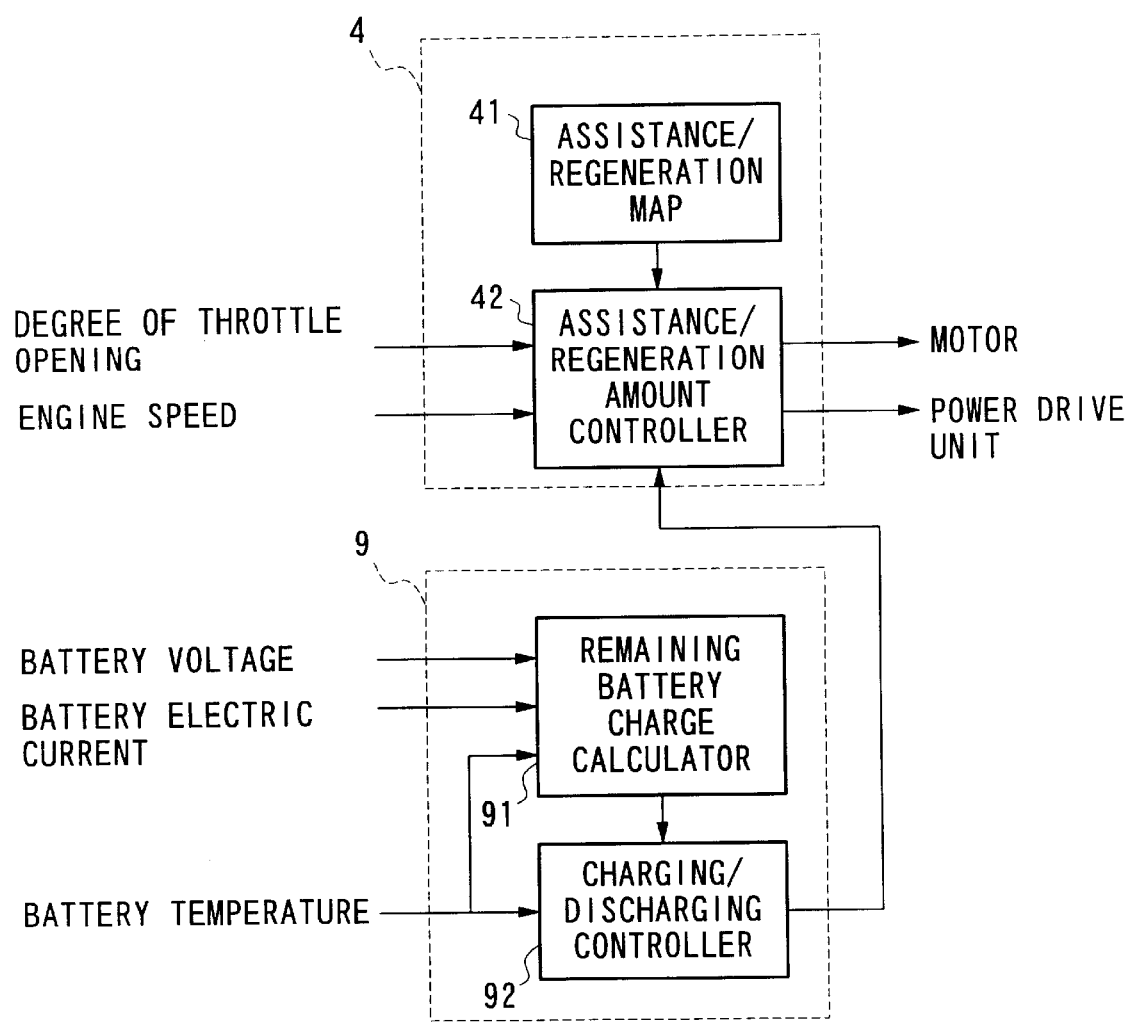
FIG. 2 is a block diagram showing the construction of the motor controller and the battery control apparatus of the present invention which are shown in FIG. 1.

Referring to FIG. 2, the construction of the motor controller 4 and the battery control apparatus 9 shown in FIG. 1 will be explained. FIG. 2 is a block diagram showing the construction of the motor controller 4 and the battery control apparatus 9. In this figure, 41 denotes an assistance/regeneration map which records the amounts of operations of the motor 2 for the production of the drive power assisting the engine 1 and for the regeneration. In the following description, "assistance" means assisting the output from the engine 1, and "regeneration" means storing the energy regenerated by the motor 2. The assistance/regeneration map defines the amounts of operations for the production of the assisting drive power and the regeneration, depending on the throttle opening degree (the extent of the throttle opening) and the engine speed of the engine 1.

42 denotes an assistance/regeneration amount controller for referring to the assistance/regeneration map, depending on the throttle opening degree and the engine speed, for determining the amount of assistance or regeneration, and for controlling the motor 2 and the power drive unit 7. 91 denotes a remaining battery charge calculator for calculating the remaining battery charge of the battery 8. The remaining battery charge calculator 91 corrects (resets) the remaining battery charge which is calculated by the integration of discharged/charged electric currents, based on the battery voltage detected by a voltage sensor provided in the battery 8. The correction of the remaining battery charge eliminates any error in the integration of the charged/discharged electric currents. 92 denotes a charge/discharge controller for determining chargeable/dischargeable amounts, depending on the temperature of the battery 8 and the remaining battery charge, and for notifying the assistance/regeneration amount controller 42 of the determined amounts.

A throttle opening sensor and an engine speed sensor, which are not shown, are provided in the engine 1, and the outputs from these sensors are input to the motor controller 4. A voltage sensor and an electric current sensor, which are not shown, are provided in the battery 8, and the output from these sensors is input to the battery control apparatus 9. Further, a plurality of temperature sensors is provided in the battery 8. The temperature sensors are attached to the respective modules that constitute the battery 8, and the outputs from these temperature sensors is input to the battery control apparatus 9.

The remaining charge of the battery 8 will be explained. The remaining charge of the battery 8 is calculated by the battery control apparatus 9, based on the voltage of the battery, the charge/discharge electric current, the temperature of the battery, and the like. The battery control apparatus 9 controls the amount of charge or discharge of the battery 8, based on the remaining charge. According to the remaining charge, the controls of the battery are divided into charge preventing zone, discharge preventing zone, and usable zone.

In the charge preventing zone, the battery may be overcharged if the charge continues. The charge preventing zone is, e.g., between 80 to 100% of the remaining charge. In the discharge preventing zone, the battery may be overdischarged and the remaining charge may be lost if the discharge continues. The discharge preventing zone is, e.g., between 0 to 20% of the remaining charge. In the usable zone, both charging and discharging are allowed. The usable zone is, e.g., between 20 to 80% of the remaining charge. The battery control apparatus 9 controls the amounts of charge and discharge so that the remaining battery charge is maintained within usable zone.

The boundaries between these zones depend on the performance of the battery. Since there is correlation between the battery voltage and the remaining battery charge, the battery voltage increases as the remaining battery charge increases. When the remaining battery charge is medium (between 20% and 80%), the change in the battery voltage is small as the remaining battery charge changes. When the remaining battery charge exceeds a predetermined value (80%), the battery voltage significantly increases. When the remaining battery charge decreases below a predetermined value (20%DA), the battery voltage significantly decreases. Therefore, the battery remaining charge can be estimated by detecting a 5 -significant increase or decrease in the battery voltage.

In usable zone, since the change in voltage of the battery 8 is small as the remaining battery charge changes, the remaining battery charge is calculated by integrating the amounts of charge and discharge of the battery 8. The calculation method by integrating the electric currents may integrate errors arising in the detection of the electric currents. Therefore, when the battery is continuously used within usable zone, and when the remaining charge has not reached the upper and lower limit values of usable zone, the error in the remaining battery charge increases. The error in the remaining battery charge, which has been calculated by integrating the charging and discharging electric currents, is removed by resetting the remaining charge to a corrected value. In the resetting process, the remaining charge is set to a predetermined value (e.g., 20%, or 80%) when detecting a significant increase or decrease in the battery voltage.

The remaining battery charge calculator 91 stores a three-dimensional map, not shown, which defines the upper and lower limit values of the battery voltage, depending on the temperature and the charging/discharging electric currents of the battery, when the remaining battery charge reaches a predetermined value. The remaining battery charge calculator 91 looks up the battery voltage in the three-dimensional map, depending on the present temperature and the present charging/discharging electric currents of the battery, when the remaining battery charge reaches the predetermined value. The remaining battery charge is reset, based on the obtained battery voltage.

Figure 4:
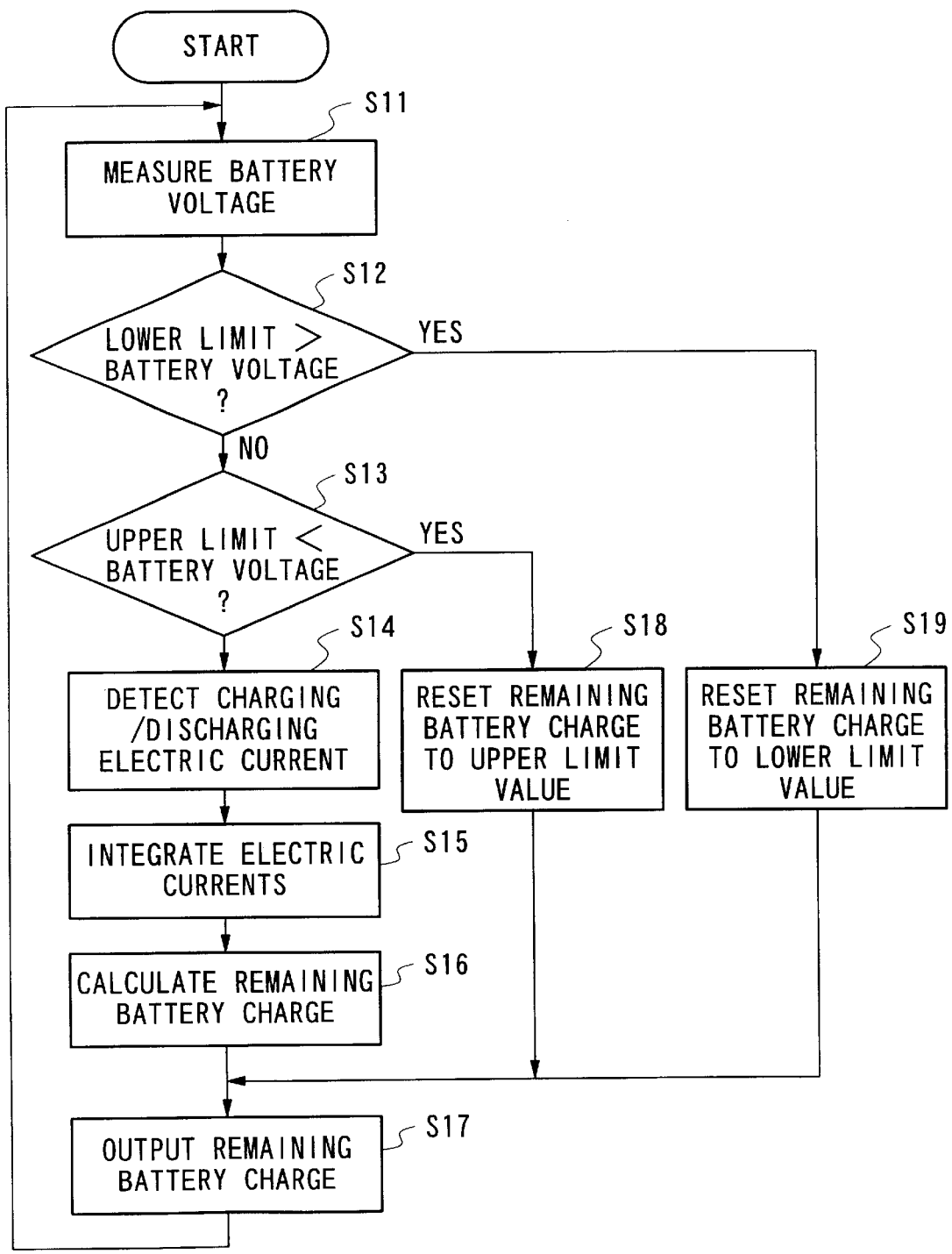
FIG. 4 is a flowchart showing the operation of the remaining battery charge calculator shown in FIG. 2.

Referring to FIG. 4, the process for calculating the remaining charge of the battery 8 is shown. FIG. 4 is a flowchart showing the process carried out by the remaining battery charge calculator 91 shown in FIG. 2.

The remaining battery charge calculator 91 measures the voltage of the battery 8 (step S11). The voltage is measured by a voltage sensor that is not shown.

Next, the remaining battery charge calculator 91 determines whether the measured voltage is below the battery lower limit voltage value (step S12). The battery lower limit voltage value is looked up in the three-dimensional map depending on the temperature and the charging/discharging electric currents of the battery described above, and corresponds to the predetermined lower limit of the remaining battery charge.

When the measured voltage value is above the battery lower limit voltage value, the remaining battery charge calculator 91 determines whether the measured voltage value is above the battery upper limit voltage value (step S13). The battery upper limit voltage value is looked up in the three-dimensional map depending on the temperature and the charging/discharging electric currents of the battery described above, and corresponds to the predetermined upper limit of the remaining battery charge.

When the measured voltage value is below the battery upper limit voltage value, the remaining battery charge calculator 91 detects the charging/discharging electric currents (step S14). The charging/discharging electric currents are detected based on the output from an electric current sensor. The amount of the charging electric current and the amount of the discharging electric current are separately detected.

Then, the remaining battery charge calculator 91 integrates the detected charging/discharging electric currents in step S14 (step S15). In the integrating process, the amount of charging electric currents and the amount of discharging electric currents are separately integrated. When the battery 8 is discharging, the measured discharging electric current is subtracted. When the battery 8 is being charged, the value obtained by multiplying the measured charging electric current by a predetermined charging efficiency (e.g., 0.95) is added.

The remaining battery charge calculator 91 calculates the present remaining battery charge, based on the integrated value of the charging/discharging electric currents and on the initial value of the remaining battery charge (step S16). The initial value of the remaining battery charge is stored in the remaining battery charge calculator 91, and is updated by the process of FIG. 4. The initial value is stored in the remaining battery charge calculator 91 even after the ignition switch has been turned off. When the ignition switch is turned on, the stored initial value of the remaining battery charge is read out.

When in step S12 the battery voltage is below the battery lower limit voltage value, the remaining battery charge calculator 91 sets the present remaining battery charge to a usable lower limit value (step S19). The usable lower limit value is the lower limit value of the remaining charge in usable the zone described above, and is, e.g., 20%. Thus, the remaining battery charge is set to the lower limit value in the usable zone, and the integrated value of the charging/discharging electric currents is thus reset.

When in step S13 the battery voltage is above the battery upper limit voltage value, the remaining battery charge calculator 91 resets the present remaining battery charge to a usable upper limit value (step S18). The usable upper limit value is the upper limit value of the remaining charge in the usable one described above, and is, e.g., 80%. Thus, the remaining battery charge is set to the upper limit value in the usable zone, and the integrated value of the charging/discharging electric currents is thus reset.

Then, the remaining battery charge calculator 91 outputs the remaining battery charge which has been calculated or reset in steps S16, S18, and S19, to the charging/discharging controller 92 (step S17).

The remaining battery charge calculator 91 repeats the process of steps S11 to S19 shown in FIG. 4 at a fixed interval. The fixed interval is determined, based on the time required to measure the battery voltage and to detect and integrate the charging/discharging electric currents.

As described above, the remaining charge of the battery 8 is calculated or reset by the remaining battery charge calculator 91 by detecting the voltage of the battery 8 and integrating the charging/discharging electric currents, and is output to the charging/discharging controller 92. The output remaining battery charge is between 20% and 80%. The charging/discharging controller 92 reads the remaining battery charge output from the remaining battery charge calculator 91, and controls the amounts of charging and discharging, based on the remaining battery charge.

Figure 3:
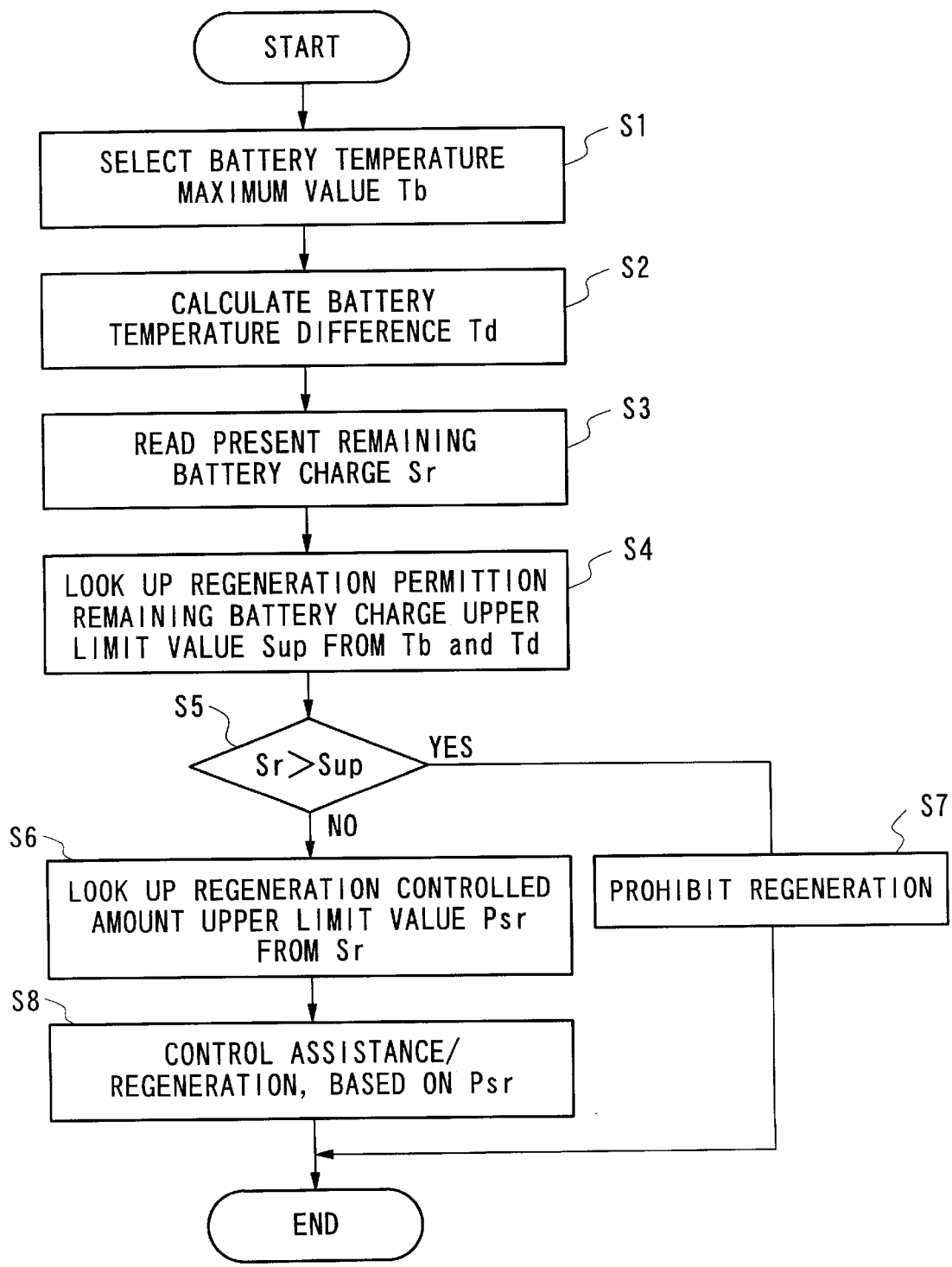
FIG 3 is a flowchart showing the operation of the motor controller and battery control apparatus of the present invention which are shown in FIG. 2.

Referring to FIG. 3, the operation of the battery control apparatus 9 shown in FIG. 2 will be explained. FIG. 3 is a flowchart showing the operation of the battery control apparatus 9 for controlling the amounts of charging and discharging.

The charging/discharging controller 92 reads outputs from a plurality of temperature sensors not shown, and selects the maximum value of the outputs (step S1). Hereinafter, the selected maximum value is referred to as the "battery temperature maximum value Tb". The charging/discharging controller 92 stores the battery temperature maximum value Tb.

Next, the charging/discharging controller 92 calculates the difference in temperature, based on the outputs read from the temperature sensors. The difference in temperature is obtained by selecting the maximum and minimum values of the outputs from the temperature sensors and calculating the difference between the maximum value and the minimum value. Hereinafter, the difference in temperature is referred to as the "battery temperature difference Td". The charging/discharging controller 92 stores the battery temperature difference Td.

Next, the charging/discharging controller 92 reads the calculated remaining charge of the battery 8 from the remaining battery charge calculator 91 (step S3). The obtained present remaining battery charge is referred to as the remaining battery charge Sr. The charging/discharging controller 92 stores the read remaining battery charge Sr.

Figure 5:
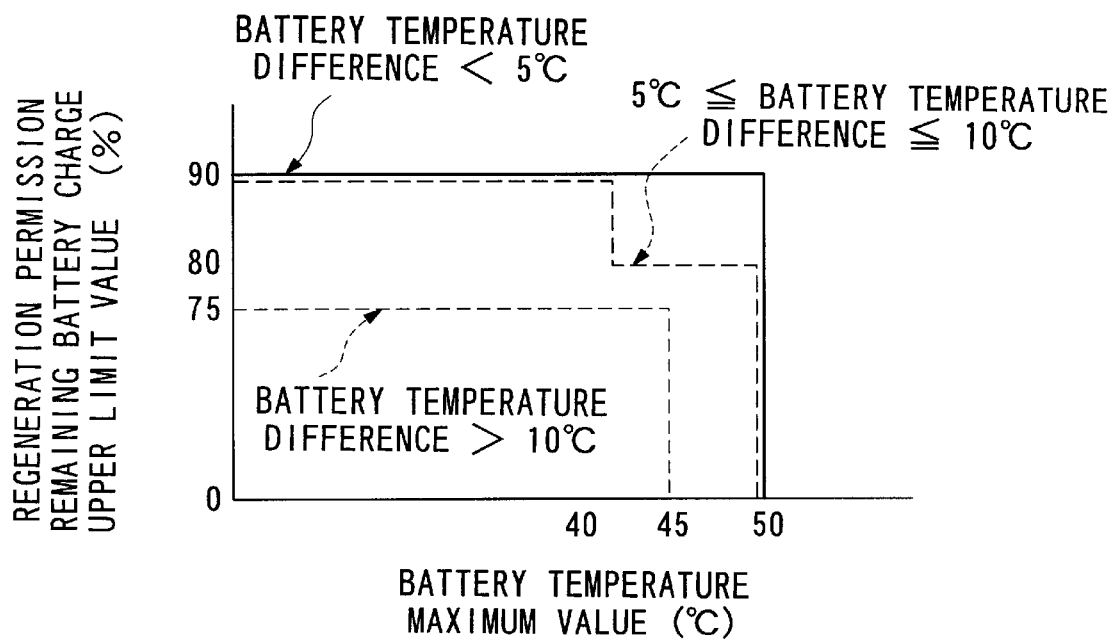
FIG. 5 is a diagram for explaining a regeneration permission remaining battery charge upper limit value map of the present invention.

Then, the charging/discharging controller 92 looks up a regeneration permission remaining battery charge upper limit value in a regeneration permission battery charge upper limit map, based on the battery temperature maximum value Tb, and the battery temperature difference Td (step S4). The regeneration permission battery charge upper limit map is shown in FIG. 5. FIG. 5 is a diagram for explaining the regeneration permission battery charge upper limit map which defines the relationship between the battery temperature maximum value Tb, the battery temperature difference Td, and the regeneration permission remaining battery charge upper limit value. In FIG. 5, the X-axis represents the battery temperature maximum value, while the Y-axis represents the regeneration permission remaining battery charge upper limit value. The solid lines indicate the case in which the battery temperature difference is below 5 degrees, the broken lines indicate the case in which the battery temperature difference is equal to or above 5 degrees and equal to or below 10 degrees, and the dotted lines indicate the case in which the battery temperature difference exceeds 10 degrees.

Thus, the regeneration permission remaining battery charge upper limit value is looked up in the regeneration permission remaining battery charge upper limit value map, based on the battery temperature maximum value Tb and the battery temperature difference Td. The obtained regeneration permission remaining battery charge upper limit value is referred to as Sup. As long as the remaining battery charge does not exceed the regeneration permission remaining battery charge upper limit value Sup, the regeneration is permitted, and the assistance/regeneration amount controller 42 performs the regeneration.

Next, the charging/discharging controller 92 compares the present remaining battery charge Sr with the regeneration permission remaining battery charge upper limit value Sup looked up in the map (step S5). When the remaining battery charge Sr is above the regeneration permission remaining battery charge upper limit value Sup, the charging/discharging controller 92 sends an instruction to prohibit regeneration, that is, to prohibit charging, to the assistance/regeneration amount controller 42 (step S7), and the control terminates.

When the remaining battery charge Sr is below the regeneration permission remaining battery charge upper limit value Sup, the charging/discharging controller 92 looks up the upper limit value of the controlled amount of regeneration in a map, based on the present remaining battery charge Sr (step S6). Hereinafter, the upper limit value of the controlled amount of regeneration, which is looked up in this process, is referred to as the "regeneration controlled amount upper limit value Psr".

Figure 6:
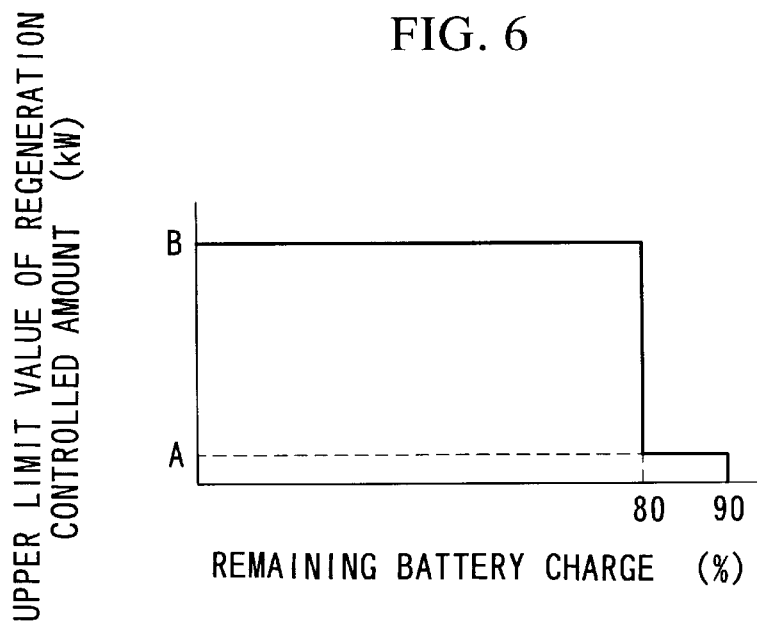
FIG. 6 is a diagram for explaining a regeneration controlled amount upper limit value map of the present invention.

FIG. 6 shows the map for looking up the controlled regeneration amount upper limit value. FIG. 6 is a diagram for explaining the regeneration controlled amount upper limit value map which defines the relationship between the remaining battery charge and the regeneration controlled amount upper limit value map. In FIG. 6, the X-axis represents the remaining battery charge, while the Y-axis represents the regeneration controlled amount upper limit value. As shown in FIG. 6, the regeneration controlled amount upper limit value is maximum when the remaining battery charge is below 80%, and is minimum when the remaining battery charge is between 80% and 90%. The maximum value of the regeneration controlled amount upper limit value, which is indicated by reference character B in FIG. 6) corresponds to the output when the charging electric current is 40A. The minimum value of the regeneration controlled amount upper limit value, which is indicated by reference character A in FIG. 6), corresponds to the output when the charging electric current is 3A.

Next, the charging/discharging controller 92 instructs the assistance/regeneration amount controller 42 to permit regeneration so that the amount of regeneration does not exceed the regeneration controlled amount upper limit value Psr which was looked up in the map, and to control the assistance and regeneration (step 58). Then, the process terminates.

On reception of the instruction, the assistance/regeneration amount controller 42 looks up the present amount of assistance or regeneration in an assistance/regeneration map 41, based on a throttle opening degree and an engine speed. When the vehicle requires the assistance (accelerates), the assistance/regeneration amount controller 42 controls the motor 2 to produce the obtained amount of assistance. When the vehicle requires regeneration (decelerates), the assistance/regeneration amount controller 42 controls the motor 2 to regenerate the obtained amount of regeneration. When the obtained amount of regeneration will exceed the regeneration controlled amount upper limit value Psr sent from the charging/discharging controller 92, the amount of regeneration is set to the upper limit value Psr.

The battery control apparatus 9 repeats steps S1 to S8 shown in FIG. 3. =1 In addition, the temperature sensors for measuring the temperatures of the respective battery modules in the battery 8 may not measures all the temperatures of the battery modules. For example, the sensor may measure only the temperatures of the battery modules which are apt to heat up and which are less apt to heat up, depending on the circumstances. Thus, the number of the sensors can be reduced, and the process of measuring the temperatures can be simplified.

As described above, the upper limit value of the remaining battery charge for permitting the regeneration is changed depending on the battery temperature and the battery temperature difference. Therefore, the regenerated energy can be effectively collected when the vehicle decelerates. Further, when the remaining battery charge is high, the battery is charged as long as the battery temperature is comparatively low, and the charging electric current is set to be low. Therefore, the battery can be charged without the battery deteriorating. Further, because the upper limit value of the remaining battery charge is preset near the full charge point, the differences in the remaining battery charge between the battery modules can be reset.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A battery control apparatus for a hybrid vehicle with a combustion engine for outputting driving force, an electric motor for generating a force for assisting the output from the engine, and a power storage unit for supplying power to the motor and for storing energy regenerated by the motor acting as a generator when the assisting force is not required, said battery control apparatus comprising:
   a remaining battery charge calculator for calculating remaining battery charge;
   a battery temperature measuring device for measuring the temperature of the battery;
   a charging permitting device for permitting charging when the remaining battery charge, which was calculated by the remaining battery charge calculator, is equal to or below a predetermined value; and
   a charging/discharging controller for setting the predetermined value, based on the temperature of the battery measured by the battery temperature measuring device.

2. A battery control apparatus for a hybrid vehicle with a combustion engine for outputting driving force, an electric motor for generating a force for assisting the output from the engine, and a power storage unit for supplying power to the motor and for storing energy regenerated by the motor acting as a generator when the assisting force is not required, said battery control apparatus comprising:

a remaining battery charge calculator for calculating remaining battery charge;

a battery temperature measuring device for measuring the temperatures of a plurality of battery modules constituting the battery and for calculating a difference between the temperatures;

a charging permitting device for permitting charging when the remaining battery charge, which was calculated by the remaining battery charge calculator, is equal to or below a predetermined value; and a charging/discharging controller for setting the predetermined value, based on the difference between the temperatures measured by the battery temperature measuring device.

3. A battery control apparatus according to any one of claims 1 and 2, wherein the charging/discharging controller sets a charging electric current depending on the remaining battery charge calculated by the remaining battery charge calculator.

* * * * *